United States Patent
Song et al.

(10) Patent No.: US 6,255,181 B1
(45) Date of Patent: Jul. 3, 2001

(54) METHOD FOR FABRICATING MOS SEMICONDUCTOR DEVICE HAVING SALICIDE REGION AND LDD STRUCTURE

(75) Inventors: Oh-Sung Song, Seoul; Ja-Hum Ku, Kyunggi-do, both of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/161,979

(22) Filed: Sep. 29, 1998

(30) Foreign Application Priority Data

Oct. 1, 1997 (KR) .................................................. 97-50829

(51) Int. Cl.⁷ .................................................. H01L 21/336
(52) U.S. Cl. .................................................. 438/305
(58) Field of Search .................................. 438/305, 529, 438/FOR 188

(56) References Cited

U.S. PATENT DOCUMENTS

| | | | |
|---|---|---|---|
| 4,951,100 | * | 8/1990 | Parrillo . |
| 5,428,240 | * | 6/1995 | Lur . |
| 5,554,549 | * | 9/1996 | Huang . |
| 5,858,849 | * | 1/1999 | Chen . |
| 5,891,785 | * | 4/1999 | Chang . |
| 5,923,982 | * | 7/1999 | Kadosh et al. . |
| 5,923,983 | * | 7/1999 | Fulford, Jr. et al. . |

* cited by examiner

Primary Examiner—George Fourson
(74) Attorney, Agent, or Firm—Jones Volentine, PLLC

(57) ABSTRACT

A method for fabricating a MOS transistor involves forming a buffering layer on an active region, performing an ion implantation to form a heavily doped region (source/drain region), and forming a self-aligned silicide region (salicide region) on exposed silicon and polysilicon gate. With this method, a salicide region free from voids can be formed because transition metal material (for example, cobalt) and silicon atoms at an interface portion between the transition metal layer and the substrate silicon are not locally accelerated or delayed during the formation of the salicide region.

8 Claims, 7 Drawing Sheets

METHOD FOR FABRICATING MOS SEMICONDUCTOR DEVICE HAVING SALICIDE REGION AND LDD STRUCTURE

FIELD OF THE INVENTION

The present invention relates to a method for fabricating MOS (metal oxide semiconductor) integrated circuit devices, and more particularly to a method for forming salicide regions (self-aligned silicide regions) in a MOS transistor having an LDD (lightly doped drain) structure.

BACKGROUND OF THE INVENTION

In fabrication of MOS devices designed to have feature sizes of 0.35 µm or less, techniques for silicidation of source/drain regions and a polysilicon gate have come into wide use in MOS transistors. Of these techniques, methods for forming a self-aligned silicide region in MOS devices are disclosed in U.S. Pat. Nos. 5,567651 and 5,605,866. These silicidation methods have been employed reduce sheet resistance in an excellent ohmic contact, source/drain region, and polysilicon interconnections; to provide an increased effective contact area; and to provide an etch stopping function.

Other known methods for fabricating MOS devices having a salicide and LDD structure are disclosed in U.S. Pat. Nos. 5,089,865, 5,508,212 and 5,554,549. In these methods, alternative materials such as cobalt, platinum, palladium, nickel, molybdenum or the like are used as salicide materials. Of these salicide materials, particularly, cobalt silicide has lower resistivity in comparison to the other salicide materials, allows low temperature processing, and allows suppression of latch up at an interface of a junction region.

There is a primary known method of forming a MOS transistor having Co-silicide (cobalt silicide) and an LDD structure. In this method, a sidewall spacer formed gate structure is first formed on a semiconductor substrate, and then lightly and heavily doped impurity regions used as source/drain regions are formed by ion implantations using the gate structure as a mask. A layer of cobalt is deposited on an upper polysilicon surface of the gate structure and on an upper surface of the heavily doped impurity region using a chemical vapor deposition process.

Following the cobalt deposition, a first heat treatment, for example, a rapid thermal annealing is carried out at a low temperature in the range of 400° C. to 500° C. to form $Co_2Si$ and CoSi where the cobalt layer is in intimate contact with the silicon or polysilicon regions. After forming the $Co_2Si$ and CoSi compounds a second heat treatment is further carried out at a higher temperature to transform the $Co_2Si$ and CoSi compounds into $CoSi_2$. $CoSi_2$ has a lower resistivity than $Co_2Si$ and CoSi formed in the initial annealing process.

However, under this process of fabricating devices void defects are thereby formed in the cobalt silicide ($CoSi_2$) layer. These voids are generated having a diameter in the range of about 800 Å to 2000 Å. This leads to an increase in junction leakage current of the respective devices. As a result, the conventional MOS transistor having voids in cobalt silicide have deteriorated electrical characteristics.

The following three reasons such void defects are generated in $CoSi_2$ can be observed as evident by using a scanning electron microscope.

(1) An active region of a semiconductor substrate has become damaged during a dry etching process of a very thin (about 50 Å or less) gate insulating layer (for example, a gate oxide layer).

(2) The active region of the semiconductor substrate has become damaged during a dry etching process of forming a gate sidewall spacer.

(3) The active region has become damaged by injecting impurity ions directly into exposed silicon, wherein the impurity ions are accelerated with high energy.

For the above-mentioned reasons, cobalt and silicon atoms at an interface area between the cobalt and silicon layers are locally accelerated or delayed while diffusing by the heat treatment, whereby the void defects are generated.

Herein, we should give attention to the fact that damage of the active region generated due to the above reasons (1) and (2) can be sufficiently prevented by using a higher etch selectivity with respect to the gate oxide layer. The invention is thus provided to solve a problem of void defects caused by the above reason (3), that is, to prevent the active region from becoming damaged during the ion implantation for forming a heavily doped region in the active region.

SUMMARY OF THE INVENTION

It is an object of the invention to provide a method for fabricating a MOS integrated circuit device with a salicide (a self-aligned silicide region) and an LDD structure which has a small leakage function.

It is another object of the invention to provide a method for forming a LDD semiconductor device having a salicide region free from voids.

It is an additional object of the invention to provide a method for fabricating a MOS integrated circuit device which can prevent its active region from becoming damaged during ion implantation for forming a heavily doped region in the active region.

According to one aspect of the present invention, a method for fabricating a MOS transistor comprises the steps of forming a buffering layer on an active region, performing an ion injection to form a heavily doped region (source/drain region), and forming a self-aligned silicide region (salicide region) on exposed silicon and on a polysilicon gate. With the above method, when the ion injection is performed to form the source/drain region, impurity ions are injected through the buffering layer into the semiconductor substrate. As a result, the substrate surface, particularly, an upper surface of the source/drain region does not become damaged during the ion injection.

BRIEF DESCRIPTION OF THE DRAWINGS

This invention may be understood and its objects will become apparent to those skilled in the art by reference to the accompanying drawings as follows.

DETAILED DESCRIPTION OF PREFERRED EMBODIMENTS

A novel method for fabricating a MOS transistor in accordance with the invention comprises forming a buffering layer on an active region, performing an ion implantation to form a heavily doped region (source/drain region), and forming a self-aligned silicide region (salicide region) on exposed silicon and on a polysilicon gate. With this method, a salicide region free from voids can be formed because transition metal material (for example, cobalt) and silicon atoms at an interface area between the transition metal layer and the substrate silicon are not locally accelerated or delayed during the formation of the salicide region.

Embodiment 1

FIGS. 1A through 1F illustrate a novel method for fabricating a MOSFET according to a first embodiment of the present invention.

Figure 1A:
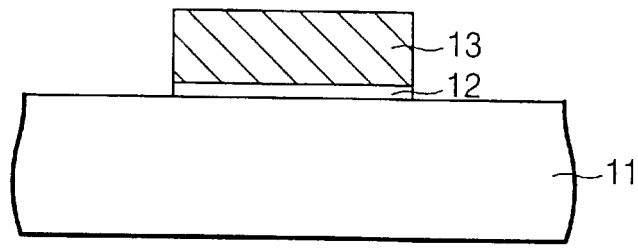
FIGS. 1A through 1F are cross-sectional views showing process steps of a novel method for fabricating a MOSFET according to a first embodiment of the present invention.

Referring to FIG. 1A, a gate insulating layer 12 of, for example, oxide and a polysilicon gate 13 are sequentially formed on an active region or an n type well of a semiconductor substrate 11, and are patterned by a photolithography and an etching process. As a result, a gate pattern consisting of the gate oxide layer 12 and the polysilicon gate 13 is formed.

Figure 1B:
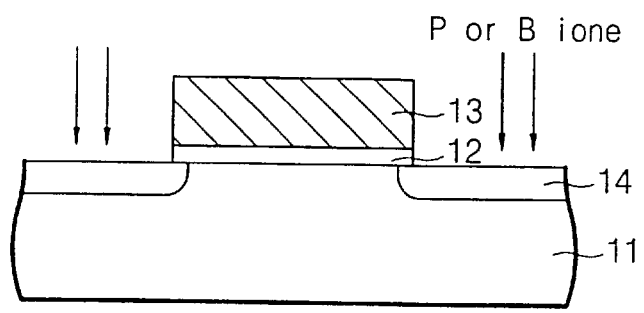

With reference to FIG. 1B, a phosphorous (or boron) ion implantation into the semiconductor substrate 11 is carried out using the gate pattern as a mask to form an n⁻ type (or p⁻ type) impurity region 14 of low concentration on both sides of the gate pattern.

Figure 1C:
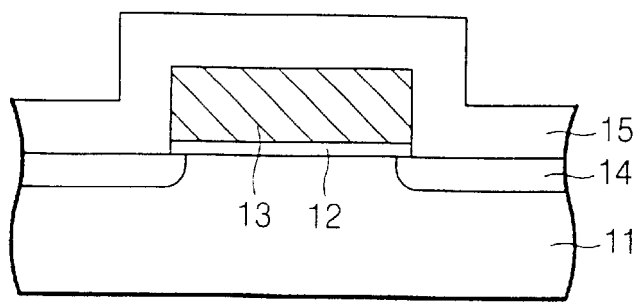

In FIG. 1C, an insulating layer 15 of, for example, $SiO_2$ or SiN is deposited over the semiconductor substrate 11 including the gate pattern.

Figure 1D:
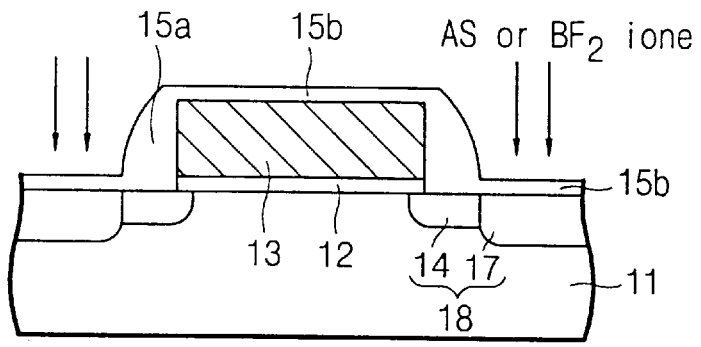

As shown in FIG. 1D, an anisotropic etch process of the insulating layer 15 is carried out in order to form a sidewall spacer 15a on both sidewalls of the gate pattern and in order that a part of the insulating layer 15 remains having a thickness of about 30 Å or more on an upper surface of the polysilicon gate 13 and on the impurity region 14. Hereinafter, the remaining insulating layer is indicated by a reference numeral 15b, and the gate pattern including the sidewall spacer 15a is referred to as a gate structure.

Next, as shown again in FIG. 1D, an arsenic (or $BF_2$) ion implantation is carried out using the gate structure as a mask to form an n⁺ type (or p⁺ type) impurity region 17. As a result, a source/drain 18 is formed which has an LDD (lightly doped drain) structure consisting of the low concentration impurity region (lightly doped source/drain extension) 14 and the high concentration impurity region (source/drain region) 17. During the ion implantation, the remaining insulating layer 15b is used as a buffering layer which is capable of preventing the active region of the semiconductor substrate from becoming damaged.

Figure 1E:
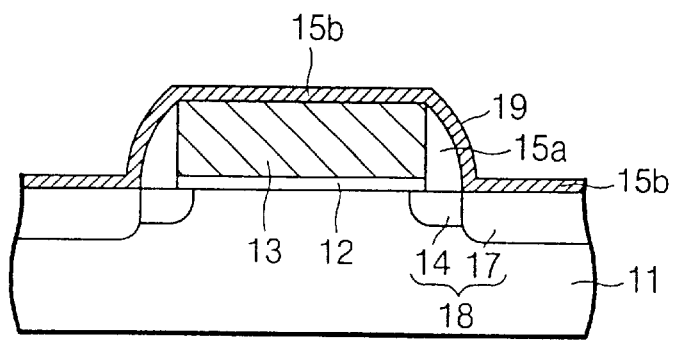

Referring to FIG. 1E, after removal of the remaining insulating layer 15b on both the upper surfaces of the polysilicon gate 13 and the source/drain region 17, a magnetic transition metal layer 19 is formed having a thickness of 100 Å to 250 Å (preferably, a thickness of about 150 Å) by PVD (physical vapor deposition) or CVD (chemical vapor deposition) using plasma. The transition metal layer 19 may be made of at least one selected from a group consisting of Co (cobalt), Ti (titanium), Ni (nickel) and the like.

Figure 1F:
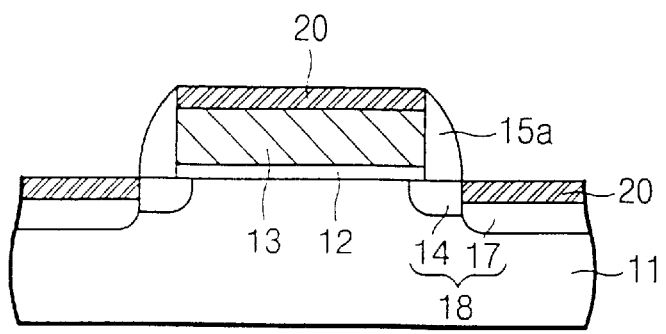

Finally, as shown in FIG. 1F, an annealing is performed so that a self-aligned silicide layer 20 having a thickness of 400 Å to 800 Å can be formed at both tops of the polysilicon gate 13 and the source/drain region 17 by reaction with the transition metal layer 19. In this embodiment, the annealing is accomplished by two continuous steps, a low-temperature RTA (rapid thermal annealing) and a high-temperature thermal annealing. Preferably, the low-temperature RTA is performed at a temperature between 400° C. to 500° C., and the high-temperature thermal annealing is performed at a temperature of approximately 650° C. or more.

After formation of the silicide layer 20, unreacted portions of the transition metal layer 19 are selectively removed, and then metalization is performed as is well-known in the art. As a result, a MOSFET is completely fabricated.

Embodiment 2

FIGS. 2A through 2G illustrate a novel method for fabricating a MOSFET according to a second embodiment of the present invention.

Figure 2A:
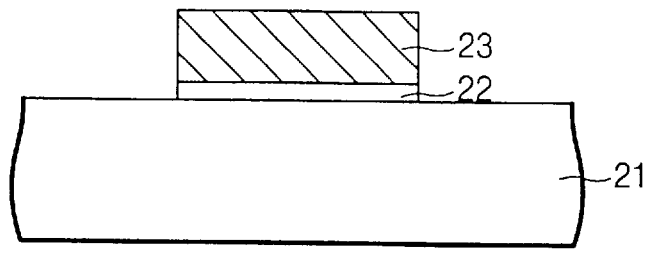
FIGS. 2A through 2G are cross-sectional views showing process steps of a novel method for fabricating a MOSFET according to a second embodiment of the present invention.

Referring to FIG. 2A, a gate insulating layer 22 of, for example, oxide and a polysilicon gate 23 are sequentially formed on an active region or an n type well of a semiconductor substrate 21, and are patterned by a photolithography and an etching process. As a result, a gate pattern consisting of the gate oxide layer 22 and the polysilicon gate 23 is formed.

Figure 2B:
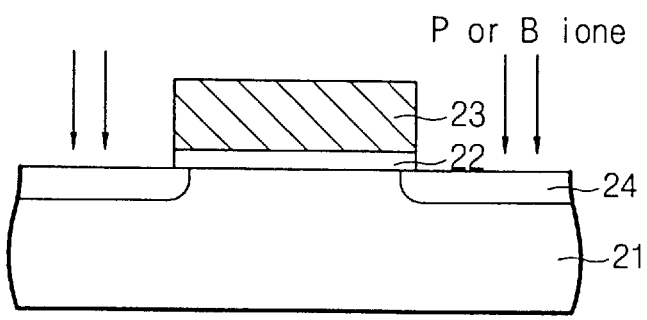

With reference to FIG. 2B, a phosphorous (or boron) ion implantation into the semiconductor substrate 21 is carried out using the gate pattern as a mask to form an n⁻ type (or p⁻ type) impurity region 24 of low concentration on both sides of the gate pattern.

Figure 2C:
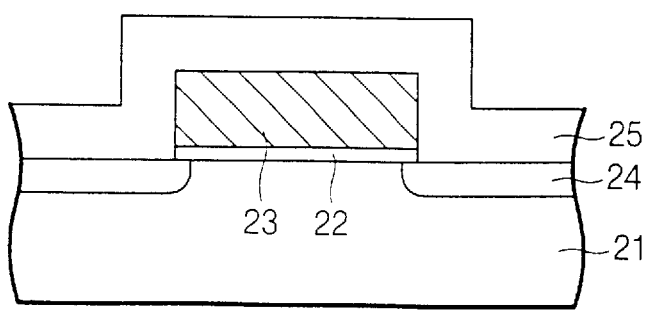

In FIG. 2C, an insulating layer 25 of, for example, $SiO_2$ or SiN is deposited over the semiconductor substrate 21 including the gate pattern.

Figure 2D:
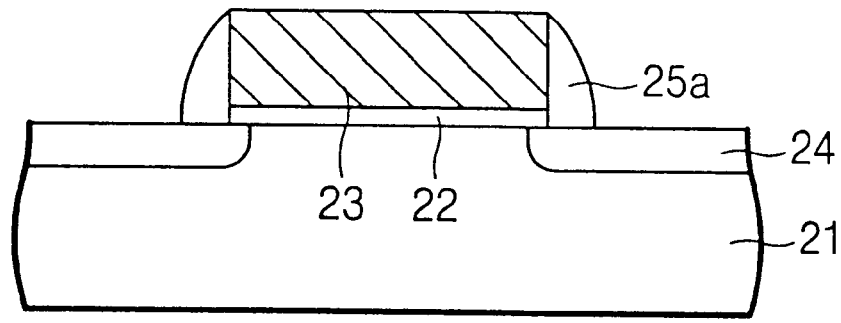

As shown in FIG. 2D, an anisotropic etch process of the insulating layer 25 is carried out to form a sidewall spacer 25a on both sidewalls of the gate pattern, and thereby a gate structure is formed.

Figure 2E:
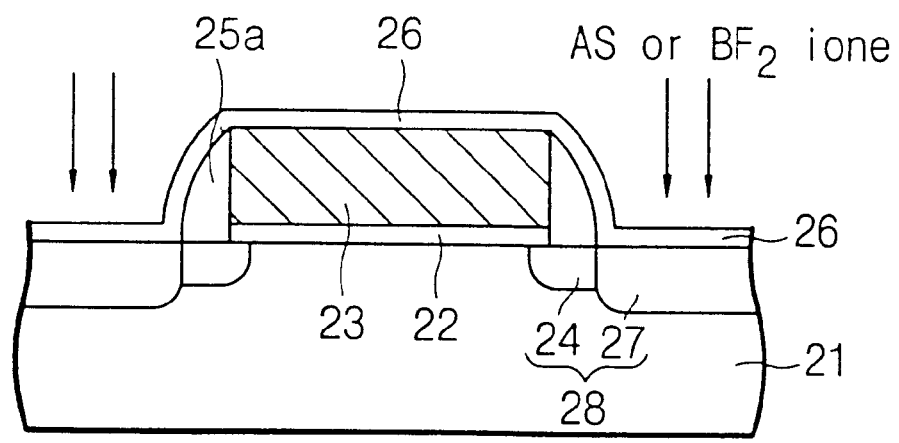

Next, as shown again in FIG. 2E, an insulating layer 26 of, for example, $SiO_2$ or SiN is formed over the semiconductor substrate including the gate pattern. The insulating layer 26 has a thickness of about 30 Å or more. And, an arsenic (or $BF_2$) ion implantation, using the gate structure as a mask, is carried out to form an n⁺ type (or p⁺ type) impurity region 27. As a result, a source/drain 28 is completely formed which has an LDD (lightly doped drain) structure consisting of the low concentration impurity region (lightly doped source/drain extension) 24 and the high concentration impurity region (source/drain region) 27. During the ion implantation, the insulating layer 26 is used as a buffering layer which is capable of preventing the active region of the semiconductor substrate from becoming damaged.

Figure 2F:
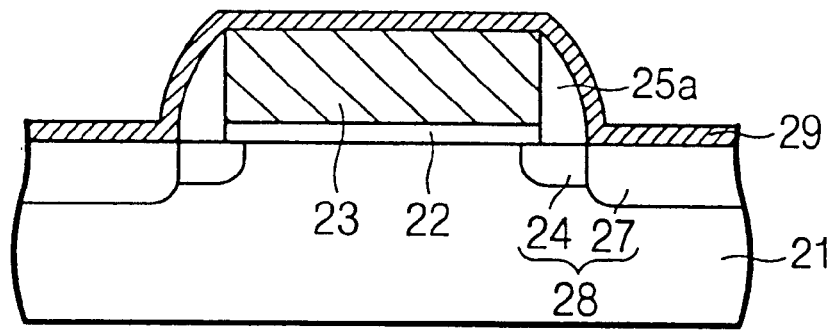

Referring to FIG. 2F, after removal of the insulating layer 26, a magnetic transition metal layer 29 is formed having a thickness of 100 Å to 250 Å (preferably, a thickness of about 150 Å) by PVD or CVD using plasma. The transition metal layer 29 may be made of at least one selected from a group consisting of Co, Ti, Ni and the like.

Figure 2G:
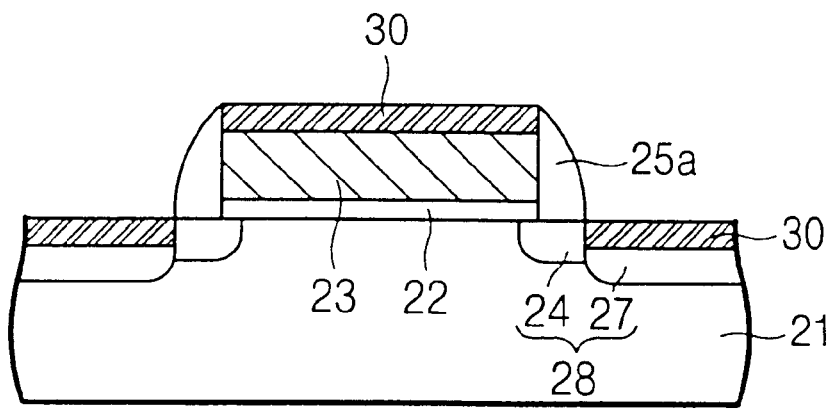

Finally, as shown in FIG. 2G, an annealing is performed so that a self-aligned silicide layer 30 having a thickness of 400 Å to 800 Å can be formed at both tops of the polysilicon gate 23 and the source/drain region 27 by reaction with the transition metal layer 29.

In this embodiment, the annealing is accomplished by two continuous steps, a low-temperature RTA (rapid thermal annealing) and a high-temperature thermal annealing, which are identically with the first embodiment. Preferably, the low-temperature RTA is performed at a temperature between 400° C. to 500° C., and the high-temperature thermal annealing is performed at a temperature of approximately 650° C. or more.

Subsequently, after formation of the silicide layer 30, unreacted portions of the transition metal layer 29 are selectively removed, and then metalization is performed as is well-known in the art.

Embodiment 3

FIGS. 3A through 3F illustrate a novel method for fabricating a MOSFET according to a third embodiment of the present invention.

Figure 3A:
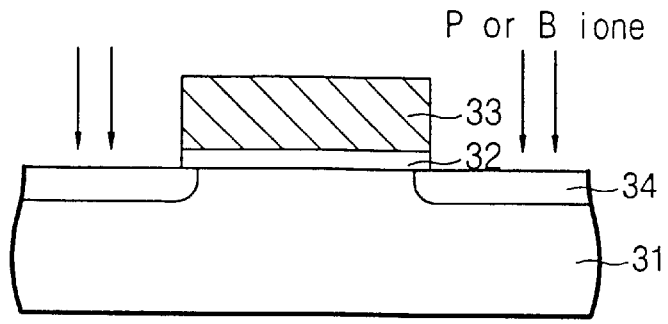
FIGS. 3A through 3F are cross-sectional views showing process steps of a novel method for fabricating a MOSFET according to a third embodiment of the present invention.

Referring to FIG. 3A, a gate insulating layer 32 of, for example, an oxide and a polysilicon gate 33 are sequentially formed on an active region or an n type well of a semiconductor substrate 31, and are patterned by a photolithography and an etching process. As a result, a gate pattern consisting of the gate oxide layer 32 and the polysilicon gate 33 is formed. Next, a phosphorous (or boron) ion implantation into the semiconductor substrate 31 is carried out using the gate pattern as a mask to form an $n^-$ type (or $p^-$ type) impurity region 34 of low concentration on both sides of the gate pattern.

Figure 3B:
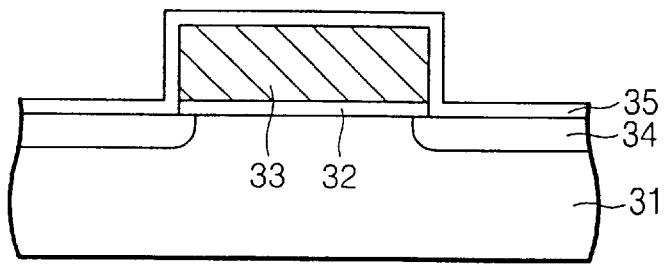
Figure 3C:
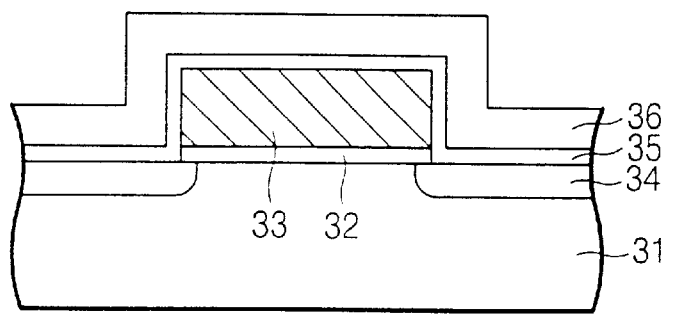

With reference to FIGS. 3B and 3C, a first insulating layer 35 of, for example, $SiO_2$ or SiN is deposited over the semiconductor substrate 31, including the gate pattern, and then a second insulating layer 36 of, for example, $SiO_2$ or SiN is also deposited on the first insulating layer 35. The first insulating layer 35 has a thickness of about 30 Å or more, and the second insulating layer 36 is formed thicker than the first insulating layer 35.

Figure 3D:
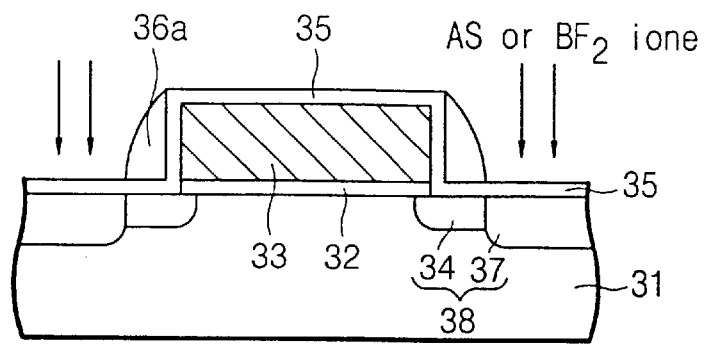

As shown in FIG. 3D, an anisotropic etch process of the second insulating layer 36 is carried out until an upper surface of the first insulating layer 35, to thereby form a sidewall spacer 36a on both sidewalls of the gate pattern. As a result, a gate structure is formed which includes the gate oxide layer 32, the polysilicon gate 33 and the sidewall spacer 36a. Next, an arsenic (or $BF_2$) ion implantation using the gate structure as a mask is carried out to form an $n^+$ type (or $p^+$ type) impurity region 37. As a result, a source/drain 38 is completely formed which has an LDD (lightly doped drain) structure consisting of the low concentration impurity region (lightly doped source/drain extension) 34 and the high concentration impurity region (source/drain region) 37. During the ion implantation, the first insulating layer 35 is used as a buffering layer which is capable of preventing the active region of the semiconductor substrate from becoming damaged.

Figure 3E:
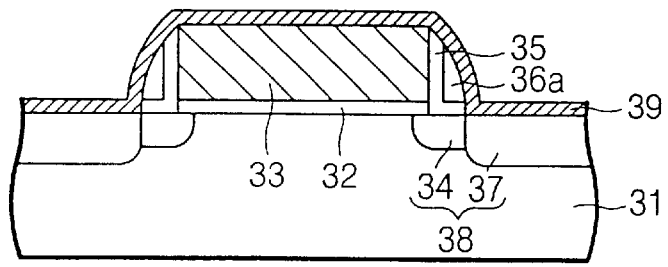

In FIG. 3E, after removal of the first insulating layer 35b exposed on both the upper surfaces of the polysilicon gate 33 and the source/drain region 37, a magnetic transition metal layer 39 is formed having a thickness of 100 Å to 250 Å (preferably, a thickness of about 150 Å) by PVD or CVD using plasma. The transition metal layer 39 may be made of at least one selected from a group consisting of Co, Ti, Ni and the like.

Figure 3F:
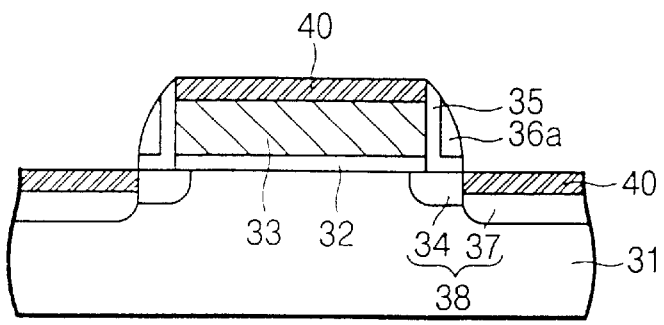

Finally, as shown in FIG. 3F, an annealing is performed so that a self-aligned silicide layer 40 having a thickness of 400 Å to 800 Å can be formed at both tops of the polysilicon gate 33 and the source/drain region 37 by reaction with the transition metal layer 39. In this embodiment, the annealing is accomplished by two continuous steps, a low-temperature RTA (rapid thermal annealing), preferably at a temperature of 400° to 500°, and a high-temperature thermal annealing of preferably, a temperature of approximately 650° or more, which are identical with the first embodiment.

After formation of the silicide layer 40, unreacted portions of the transition metal layer 39 are selectively removed, and then metalization is performed as is well-known in the art. As a result, a MOSFET is completely fabricated.

Thus, the present invention has the advantage of using an LDD-forming method, which can protect an active region of a semiconductor substrate from becoming damaged during an ion implantation for forming a source/drain region of high concentration, because of a buffering layer formed on the active region. Therefore, MOSFET devices which are manufactured according to the method can exhibit improved electrical characteristics.

What is claimed is:

1. A method for fabricating a metal oxide semiconductor (MOS) transistor, comprising:

forming a gate pattern on a semiconductor substrate of a first conductivity type, said gate pattern including a gate insulating layer and a polysilicon gate sequentially formed thereon;

injecting low concentration impurity ions of a second conductivity type into the semiconductor substrate, using the gate pattern as a mask, to form lightly doped regions at both sides of the gate pattern;

forming an insulating layer on the semiconductor substrate, including the gate pattern;

anisotropically etching the insulating layer to form sidewall spacers on both sidewalls of the gate pattern and to leave a portion of the insulating layer on the semiconductor substrate, wherein the gate pattern and the sidewall spacers constitute a gate structure;

injecting high concentration impurity ions of the second conductivity type into the semiconductor substrate, using the gate structure as a mask, to form heavily doped regions at both sides of the gate structure;

removing said portion of the insulating layer to expose an upper surface of the heavily doped region, wherein the lightly and heavily doped regions constitute a source/drain;

forming a transition metal layer over the semiconductor substrate, including the gate structure; and annealing the semiconductor substrate to form a silicide layer on an upper surface of the polysilicon gate and on the heavily doped regions based on reaction of the transition metal layer with the polysilicon gate and the heavily doped regions.

2. A method for fabricating a metal oxide semiconductor (MOS) transistor, comprising:

forming a gate pattern on a semiconductor substrate of a first conductivity type, said gate pattern including a gate insulating layer and a polysilicon gate sequentially formed thereon;

injecting low concentration impurity ions of a second conductivity type into the semiconductor substrate, using the gate pattern as a mask, to form lightly doped regions at both sides of the gate pattern;

forming sidewall spacers on both sidewalls of the gate pattern to form a gate structure consisting of the gate pattern and the spacers;

forming a buffering layer over the semiconductor substrate, including over the gate structure and the lightly doped regions;

with the buffering layer disposed over the lightly doped regions at both sides of the gate structure, injecting high concentration impurity ions of the second conductivity type through the buffering layer into the semiconductor substrate, using the gate structure as a mask, to form heavily doped regions at both sides of the gate structure;

removing the buffering layer to expose an upper surface of the heavily doped regions and the gate structure, wherein the lightly and heavily doped regions constitute a source/drain;

once the buffering layer has been removed, forming a transition metal layer over the semiconductor substrate, including over the sidewall spacers and polysilicon gate of the exposed gate structure and the exposed heavily doped regions; and annealing the semiconductor substrate to form a silicide layer on an upper surface of the polysilicon gate and on the heavily doped regions based on reaction of the transition metal layer with the polysilicon gate and the heavily doped regions;

wherein said buffering layer has a thickness sufficient to prevent the lightly doped regions from becoming damaged during said ion injection for forming said heavily doped regions.

3. The method according to claim 2, wherein said transition metal layer is magnetic.

4. The method according to claim 3, wherein said magnetic transition metal layer comprises at least one selected from a group consisting of cobalt, titanium, or nickel.

5. The method according to claim 2, wherein said buffering layer comprises an insulator.

6. The method according to claim 5, wherein said insulator comprises $SiO_2$ or SiN.

7. The method according to claim 2, wherein said thickness of said buffering layer is about 30 Å.

8. The method according to claim 2, wherein said transition metal layer is formed by physical vapor deposition or chemical vapor deposition using plasma.

* * * * *